(12) United States Patent
Chen et al.

(10) Patent No.: US 12,207,570 B2
(45) Date of Patent: Jan. 21, 2025

(54) PHASE CHANGE MEMORY WITH MULTI-LEVEL PROGRAMMING

(71) Applicant: INTERNATIONAL BUSINESS MACHINES CORPORATION, Armonk, NY (US)

(72) Inventors: Ching-Tzu Chen, Ossining, NY (US); Juntao Li, Cohoes, NY (US); Kangguo Cheng, Schenectady, NY (US); Carl Radens, Lagrangeville, NY (US)

(73) Assignee: International Business Machines Corporation, Armonk, NY (US)

( * ) Notice: Subject to any disclaimer, the term of this patent is extended or adjusted under 35 U.S.C. 154(b) by 426 days.

(21) Appl. No.: 17/655,081

(22) Filed: Mar. 16, 2022

(65) Prior Publication Data

US 2023/0301207 A1    Sep. 21, 2023

(51) Int. Cl.
*H10N 70/20* (2023.01)
*H10B 63/00* (2023.01)
*H10B 63/10* (2023.01)
*H10N 70/00* (2023.01)

(52) U.S. Cl.
CPC ........... *H10N 70/231* (2023.02); *H10B 63/10* (2023.02); *H10B 63/845* (2023.02); *H10N 70/063* (2023.02); *H10N 70/823* (2023.02); *H10N 70/8822* (2023.02); *H10N 70/8825* (2023.02); *H10N 70/8828* (2023.02)

(58) Field of Classification Search
CPC .. H10N 70/231; H10N 70/063; H10N 70/823; H10N 70/8822; H10N 70/8825; H10N 70/8828; H10B 63/10; H10B 63/845
See application file for complete search history.

(56) References Cited

U.S. PATENT DOCUMENTS

| | | | |
|---|---|---|---|
| 7,787,291 B2 | 8/2010 | Resta | |
| 7,833,824 B2 | 11/2010 | Lee | |
| 7,932,508 B2 | 4/2011 | Hosaka | |
| 7,952,919 B2 | 5/2011 | Liu | |
| 8,187,946 B2 | 5/2012 | Karpov | |
| 8,809,828 B2 | 8/2014 | Breitwisch | |
| 9,171,616 B2 | 10/2015 | Liu | |

(Continued)

OTHER PUBLICATIONS

M. Longo, "6-Nanowire phase change memory (PCM) technologies: principles, fabrication and characterization techniques," Advances in Non-volatile Memory and Storage Technology, 2014 (Year: 2014).*

(Continued)

*Primary Examiner* — Joseph C. Nicely
*Assistant Examiner* — Alvin L Lee
(74) *Attorney, Agent, or Firm* — Jeffrey Ingalls

(57) ABSTRACT

A phase change memory (PCM) semiconductor device is provided. The PCM semiconductor device includes: a phase change material stack on a substrate, the phase change material stack including at least two phase change material layers each separated by an insulating layer; a first electrode on a first side of the phase change material stack; and a second electrode on a second side of the phase change material stack, wherein a first one of the phase change material layers has a length that is different from a length of a second one of the phase change material layers.

16 Claims, 8 Drawing Sheets

(56) References Cited

U.S. PATENT DOCUMENTS

| | | | |
|---|---|---|---|
| 9,337,421 B2 | 5/2016 | Chin | |
| 2011/0062409 A1* | 3/2011 | Liu | H10N 70/043 |
| | | | 257/E21.004 |
| 2014/0291603 A1* | 10/2014 | Song | H10N 70/883 |
| | | | 257/4 |
| 2015/0103588 A1* | 4/2015 | Son | H10B 63/20 |
| | | | 365/163 |
| 2020/0411754 A1* | 12/2020 | Ruiz | H10N 70/063 |
| 2021/0184112 A1* | 6/2021 | Cheng | H10B 63/24 |

OTHER PUBLICATIONS

Wabe, et al.,"Projected Phase-Change Memory Devices," Nature Communications DOI: 10.1038/ncomms9181, Sep. 3, 2015, 7 pages, McMillan Publishers Limited.

\* cited by examiner

PHASE CHANGE MEMORY WITH MULTI-LEVEL PROGRAMMING

BACKGROUND

The present disclosure generally relates to fabrication methods and resulting structures for semiconductor based electronic devices. More specifically, the present disclosure relates to a phase-change memory (PCM) device and method of manufacturing a PCM device.

Phase-change memory (PCM) structures are a type of memory device considered for analog computing. PCM is an emerging non-volatile (NV) random-access memory (RAM) which offers some advantages over existing non-volatile memories (NVMs). It has potential for both classic memory applications and neuromorphic computing.

In a PCM device, a phase change material is formed between two electrodes and the resistance can change via a phase change between the crystalline and the amorphous state, and this change in resistance is reversible. A phase change material can be converted to the amorphous state by heating it above the melting temperature followed by rapid cooling (quenching), which achieves high resistance. In contrast, the phase change material can be brought back to the crystalline state when it is annealed at a lower temperature but for a relatively longer time, which achieves low resistance. It may be desirable to have multiple conductance states of a PCM device so that the device can be used as an analog memory device. This may allow for a greater number of memory states without increasing the footprint of the device.

SUMMARY

Embodiments of the present disclosure relate to a phase change memory (PCM) device is provided. The PCM semiconductor device includes: a phase change material stack on a substrate, the phase change material stack including at least two phase change material layers each separated by an insulating layer; a first electrode on a first side of the phase change material stack; and a second electrode on a second side of the phase change material stack, wherein a first one of the phase change material layers has a length that is different from a length of a second one of the phase change material layers.

Embodiments of the present disclosure relate to a method of manufacturing a phase change memory (PCM) device. The method includes: forming a phase change material stack on a substrate, the phase change material stack including at least two phase change material layers each separated by an insulating layer; forming a first electrode on a first side of the phase change material stack; and forming a second electrode on a second side of the phase change material stack, wherein a first one of the phase change material layers has a length that is different from a length of a second one of the phase change material layers. The above summary is not intended to describe each illustrated embodiment or every implementation of the present disclosure.

BRIEF DESCRIPTION OF THE DRAWINGS

The drawings included in the present application are incorporated into, and form part of the specification. They illustrate embodiments of the present disclosure and, along with the description, explain the principles of the disclosure. The drawings are only illustrative of certain embodiments and do not limit the disclosure.

DETAILED DESCRIPTION

Figure 1:
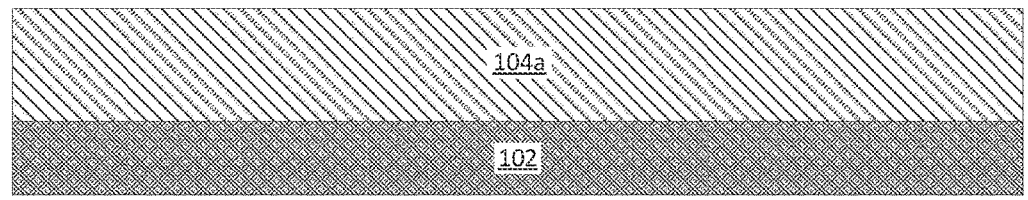
FIG. 1 is a cross-sectional view of a PCM memory cell semiconductor device at an intermediate stage of the manufacturing process, according to embodiments.

The present disclosure generally relates to fabrication methods and resulting structures for semiconductor-based electronic devices. In particular, the present disclosure relates to phase change memory (PCM) devices and PCM memory cells, and methods of manufacturing same.

The flowcharts and cross-sectional diagrams in the Figures illustrate methods of manufacturing the hybrid memory cells according to various embodiments. In some alternative implementations, the manufacturing steps may occur in a different order than that which is noted in the Figures, and certain additional manufacturing steps may be implemented between the steps noted in the Figures. Moreover, any of the layered structures depicted in the Figures may contain multiple sublayers.

Various embodiments of the present disclosure are described herein with reference to the related drawings.

Alternative embodiments can be devised without departing from the scope of the present disclosure. It is noted that various connections and positional relationships (e.g., over, below, adjacent, etc.) are set forth between elements in the following description and in the drawings. These connections and/or positional relationships, unless specified otherwise, can be direct or indirect, and the present disclosure is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements. It should be noted, the term "selective to," such as, for example, "a first element selective to a second element," means that a first element can be etched, and the second element can act as an etch stop.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

Turning now to an overview of technologies that are more specifically relevant to aspects of the present disclosure, phase-change memory (also known as PCM, PCME, PRAM, PCRAM, OUM (ovonic unified memory) and C-RAM or CRAM (chalcogenide RAM)) is a type of non-volatile random-access memory. PMCs exploit the unique behavior of chalcogenide glass. Phase change materials, such as chalcogenides, can be caused to change phase between an amorphous state and a crystalline state by application of electrical current at levels suitable for implementation in integrated circuits. The generally amorphous state is characterized by higher resistivity than the generally crystalline state, which can be readily sensed to indicate data.

Phase change materials in PCM devices are capable of being switched between a first structural state in which the material is in a generally amorphous solid phase, and a second structural state in which the material is in a generally crystalline solid phase in the active region of the cell. The term "amorphous" is used to refer to a relatively less ordered structure, more disordered than a single crystal, which has the detectable characteristics such as higher electrical resistivity than the crystalline phase. The term "crystalline" is used to refer to a relatively more ordered structure, more ordered than in an amorphous structure, which has detectable characteristics such as lower electrical resistivity than the amorphous phase. Other material characteristics affected by the change between amorphous and crystalline phases include atomic order, free electron density and activation energy. The material can be switched into either different solid phases or mixtures of two or more solid phases, providing a gray scale between completely amorphous and completely crystalline states.

The change from the amorphous to the crystalline state in PCM devices is generally a lower current operation, requiring an applied voltage that exceeds the threshold voltage to induce switching. The change from crystalline to amorphous, referred to as "reset," is generally a higher current operation, which includes a short high current density pulse to melt or break down the crystalline structure, after which the phase change material cools quickly, quenching the phase change process, thus allowing at least a portion of the phase change structure to stabilize in the amorphous state. It may be desirable to minimize the magnitude of the reset current used to cause transition of phase change material from a crystalline state to an amorphous state because the footprint of the access transistors for the PCM devices can be reduced accordingly, which increases the device density.

Phase change memory (PCM) may be utilized in certain machine learning applications. An Artificial Neural Network (ANN) (also referred to as a neural network) is a computing system made up of a number of simple, highly interconnected processing elements (nodes), which process information by their dynamic state response to external inputs. ANNs are processing devices (algorithms and/or hardware) that are loosely modeled after the neuronal structure of the mammalian cerebral cortex, but on much smaller scales. A large ANN might have hundreds or thousands of processor units, whereas a mammalian brain has billions of neurons with a corresponding increase in magnitude of their overall interaction and emergent behavior. A feedforward neural network is an artificial neural network where connections between the units do not form a cycle. A deep learning neural network (DNN) is an ANN with multiple hidden layers of units between the input and output layers and many more "synapses" connecting between the units in adjacent layers. Similar to shallow ANNs, DNNs can model complex non-linear relationships. DNN architectures, e.g., for object detection and parsing, generate compositional models where the object is expressed as a layered composition of image primitives. The extra layers enable composition of features from lower layers, giving the potential of modeling complex data with fewer units than a similarly performing shallow network. DNNs are typically designed as feedforward networks. Machine learning, which is a subset of AI, utilizes algorithms to learn from data (e.g., Big Data) and create foresights based on this data. AI refers to the intelligence when machines, based on information, are able to make decisions, which maximizes the chance of success in a given topic. More specifically, AI is able to learn from a data set to solve problems and provide relevant recommendations. AI is a subset of cognitive computing, which refers to systems that learn at scale, reason with purpose, and naturally interact with humans. Cognitive computing is a mixture of computer science and cognitive science. Cognitive computing utilizes self-teaching algorithms that use data, visual recognition, and natural language processing to solve problems and optimize processes. In certain examples, the PCM devices of the present embodiments may be used to represent the synaptic weights of a neural network for artificial intelligence (AI) applications.

Phase change memory (PCM) has emerged as a viable memory technology and has been considered to be a potential next-generation non-volatile solid-state memory. However, in order to achieve high density phase change memory device, it is necessary to realize a multi-level cell capable of storing two or more bits of data in one cell as a minimum storage unit. Intermediate resistances between amorphous and crystalline can be formed by an incomplete phase transition within the material, or by the size and shape of the amorphous region within the phase change material. One method for programming the standard mushroom-cell devices relies on partial melt-quench and partial crystallization of the PCM material by pulsing the device with a sufficiently high current. Consequently, several local material properties vary from pulse to pulse, e.g., the crystalline domain size, crystalline orientation, local ordering in the quenched amorphous region, and so on, which gives rise to undesirable intra-device variabilities and innate programming asymmetry in device conductance. This calls for new methods and device innovations to enable more symmetric, more controllable, multi-level programming in one PCM cell for multi-level storage and analog AI applications.

Embodiments in accordance with the present disclosure provide methods and devices for employing a PCM based memory device with a plurality of phase change material layers, each layer having a different length (or width, or lateral dimension). In certain embodiments, a phase change memory device (or cell) is manufactured by forming a stack with alternating phase change material and insulator layers. The stack is patterned to produce phase change material layers (or nanowires) with different lengths, and then electrodes are formed on both sides of the nanowire stack. With this structure where the PCM layers have different dimensions, it becomes possible to program multiple bits of information by forming individual plugs of amorphous state PCM material in the PCM layers with a plurality of different voltage pulses. The present embodiments provide a method and structure for forming multi-level programmable vertical phase change memory device. More specifically, each PCM cell has a modulated geometry for phase change material segments between the pair of electrodes, either inner and outer electrodes, or left and right electrodes. Each PCM segment will go through phase change from crystalline to amorphous in sequence during programming to obtain multiple resistance states. The devices of the present embodiments can therefore be programmed from high to low conductance bidirectionally and with a reduced conductance asymmetry.

Referring now to the drawings in which like numerals represent the same or similar elements and initially to FIG. 1, a PCM memory cell 100 to which the present embodiments may be applied is shown. As shown in FIG. 1, the cell 100 includes a base semiconductor substrate 102. In certain embodiments, the semiconductor substrate 102 includes a semiconductor material including, but not limited to, silicon (Si), silicon germanium (SiGe), silicon carbide (SiC), Si: C (carbon doped silicon), silicon germanium carbide (SiGeC), carbon doped silicon germanium (SiGe: C), II-V compound semiconductor or another like semiconductor. In addition, multiple layers of the semiconductor materials can be used as the semiconductor material of the substrate. The semiconductor substrate can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide or nitride layer. There may be any suitable number of intermediate layers between the substrate 102 and the remainder of the PCM memory cell 100, and in FIG. 1 the substrate 102 is shown as the bottom layer for the sake of simplicity and ease of illustration. The substrate 102 may also include one or more other devices such as transistors, isolation structures, contacts, wires, etc. As shown in FIG. 1, a first interlayer dielectric 104a is formed on the substrate 102. The first interlayer dielectric 104a may comprise one or more suitable dielectric materials such as $SiO_2$.

Figure 2:
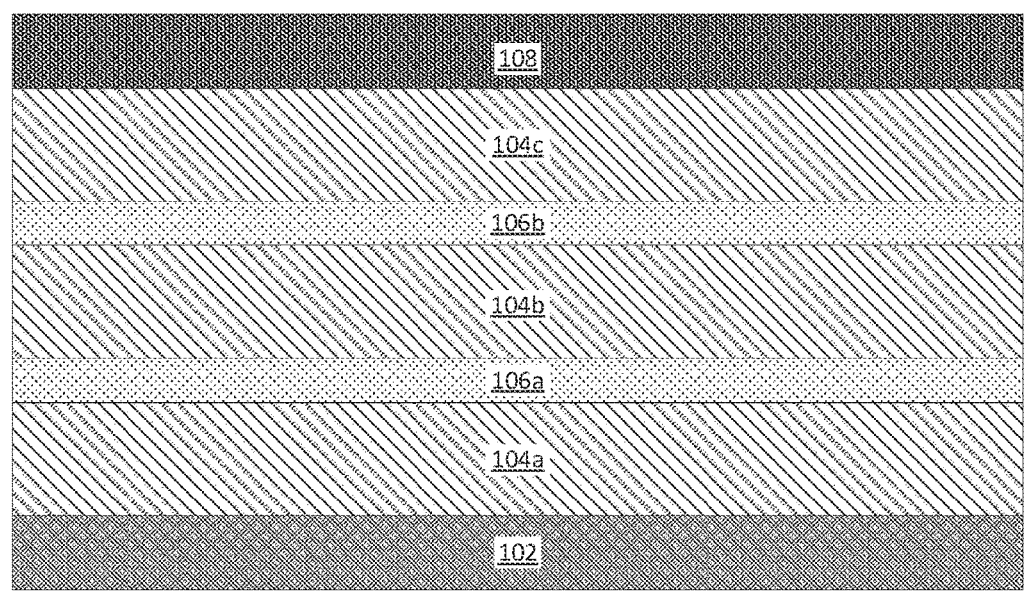
FIG. 2 is a cross-sectional view of the semiconductor device of FIG. 1 after additional fabrication operations, according to embodiments.

Referring now to FIG. 2, this figure is a cross-sectional view of the PCM memory cell 100 of FIG. 1 after additional manufacturing operations, according to embodiments. As shown in FIG. 2, a first phase change material layer 106a is formed on the first interlayer dielectric 104a. In certain PCM memory devices, heat produced by the passage of an electric current through the phase change material layer 106a may be used to either quickly heat and quench the glass, making it amorphous, or to hold it in its crystallization temperature range for some time, thereby switching it to a crystalline state. In general, PCMs are based on the peculiar properties of chalcogenide materials, that is, compounds based on sulfur, selenium, or tellurium, such as GeSe, As—S, Sb—Te and $In_2Se_3GeAsTe$, or GeSbTe (GST). The latter is the most frequently used material in PCMs such as in the phase change material layer 106a and 106b shown in FIG. 2. For example, the phase change material can include a Ge—Sb—Te (germanium-antimony-tellurium or "GST", such as $Ge_2Sb_2Te_5$) alloy. Alternatively, other suitable materials for the phase change material include Si—Sb—Te (silicon-antimony-tellurium) alloys, Ga—Sb—Te (gallium-antimony-tellurium) alloys, Ge—Bi—Te (germanium-bismuth-tellurium) alloys, In—Se (indium-tellurium) alloys, As—Sb—Te (arsenic-antimony-tellurium) alloys, Ag—In—Sb—Te (silver-indium-antimony-tellurium) alloys, Ge—In—Sb—Te alloys, Ge—Sb alloys, Sb—Te alloys, Si—Sb alloys, and combinations thereof. In some embodiments, the first phase change material layer 106a and/or the second phase change material layer 106b can be superlattice or multilayer of phase change materials, such as, $Sb_2Te_3$/$TiTe_2$, $Sb_2Te_3$/GeTe, GST/carbon, etc. In some embodiments, the phase change material can further include nitrogen, carbon, and/or oxygen. In some embodiments, the phase change material can be doped with dielectric materials including but not limited to aluminum oxide ($Al_2O_3$), silicon oxide ($SiO_2$), (tantalum oxide ($Ta_2O_5$), hafnium oxide ($HfO_2$), zirconium oxide ($ZrO_2$), cerium oxide ($CeO_2$), silicon nitride (SiN), silicon oxynitride (SiON), etc. The phase change material of the first phase change material layer 106a and/or the second phase change material layer 106b can be deposited utilizing physical vapor deposition (PVD), magnetron-assisted sputtering, chemical vapor deposition (CVD), atomic layer deposition (ALD), evaporation, ion beam deposition, electron beam deposition, laser assisted deposition, chemical solution deposition, or any other suitable deposition techniques. After deposition, the phase change material can be planarized, for example, by chemical mechanical polish (CMP).

Memory switching in these materials is primarily a thermal process, which involves a phase transformation from a crystalline to an amorphous state, and vice versa, under the influence of a current. When the heating process stops, the material of the phase change material layer 106a and/or 106b retains its new state, thus exhibiting memory. In practice, this transformation is achieved by passing a constant current through the sample for some time. The transition to an amorphous state (the RESET operation) occurs by resistive heating up to the local melting of the phase change material layer 106a and/or 106b. To switch back to the low resistance crystalline state (the SET operation), a lower and longer pulse may be applied. The resistance change between the two states is ~2-3 orders of magnitude, so that reading can easily be accomplished by low-bias nondestructive detection of the cell resistance.

As also shown in FIG. 2, a second interlayer dielectric 104b is formed on the first phase change material layer 106a. Then a second phase change material layer 106b is formed on the second interlayer dielectric 104b, followed by a third interlayer dielectric 104c formed on the second phase change material layer 106b. It should be appreciated that the total number of alternating phase change material layers and interlayer dielectric layers may be greater than that shown in FIG. 2 (e.g., three or four or more phase change material layers). It should also be appreciated that the materials of the individual phase change material layers may be the same or may be different to enable fine tuning of the different crystalline/amorphous phases of the different layers. In certain embodiments, liner layers (not shown) maybe formed at the interfaces of the phase change material layers and the interlayer dielectric layers. The liner layers may comprise, for example, TaN or a-C.

Then, as shown in FIG. 2, a hardmask 108 is formed over the third interlayer dielectric 104c (i.e., over the topmost interlayer dielectric layer in the case that more than three total layers are used). In certain examples, the hardmask 108 can include a nitride-containing material, such as, e.g., a silicon nitride ($Si_3N_4$), a silicon oxynitride ($SiO_xN_y$), a silicon carbonitride (SiCN), a silicon-boron-nitride (Si—B—N), a silicon-doped boron-carbide (Si—BC), a silicon boron-carbonitride (Si—B—CN), a boron carbide (BC), a boron nitride (BN), or combinations thereof. However, the hardmask 108 can include any suitable dielectric material that can be deposited by, e.g., chemical vapor deposition (CVD) and related methods. Other compositions for the mask include, but are not limited to, silicon oxides, silicon carbides, etc. Spin-on dielectrics that can be utilized as a material for the mask can include, but are not limited to: silsesquioxanes, siloxanes, and boron phosphate silicate glass (BPSG). In certain embodiments, the hardmask 108 can include more than one layer, and these various layers may have the same or different material compositions.

Figure 3:
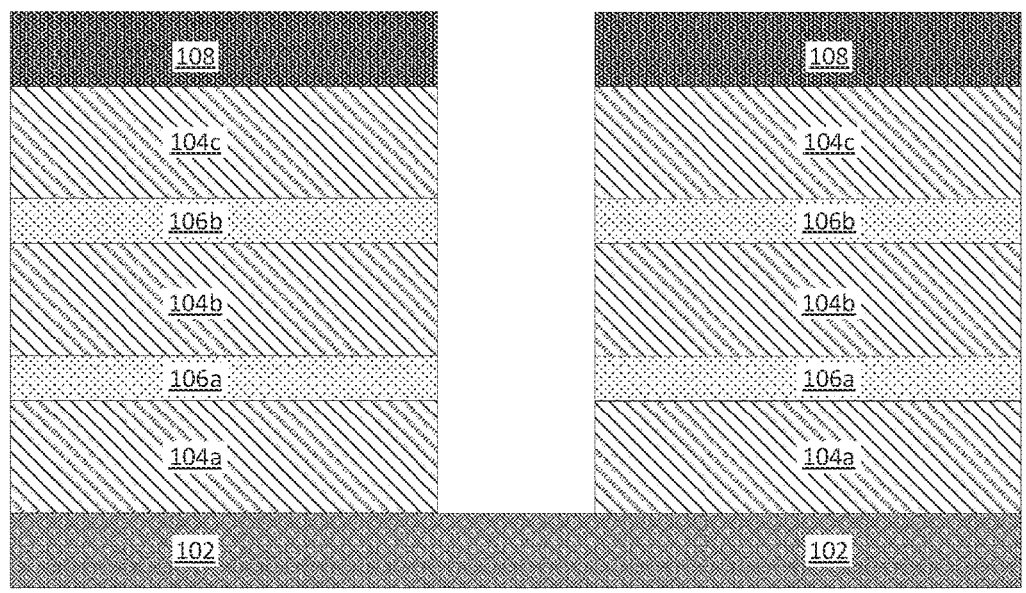
FIG. 3 is a cross-sectional view of the semiconductor device of FIG. 2 after additional fabrication operations, according to embodiments.

Referring now to FIG. 3, this figure is a cross-sectional view of the PCM memory cell 100 of FIG. 2 after additional fabrication operations, according to embodiments. As shown in FIG. 3, the hardmask 108 is used to pattern the PCM stack (i.e., the first interlayer dielectric 104a, the first phase change material layer 106a, the second interlayer dielectric 104b, the second phase change material layer 106b and the third interlayer dielectric 104c). These layers may be patterned, and any suitable material removal process (e.g., reactive ion etching or RIE) may be used to form the structure shown in FIG. 3. In other examples, a two-step etching process may be performed that includes first etching the hardmask 108 layer (e.g., with RIE) and stopping on the third interlayer dielectric 104c, then secondly etching the remainder of the stack.

Figure 4:
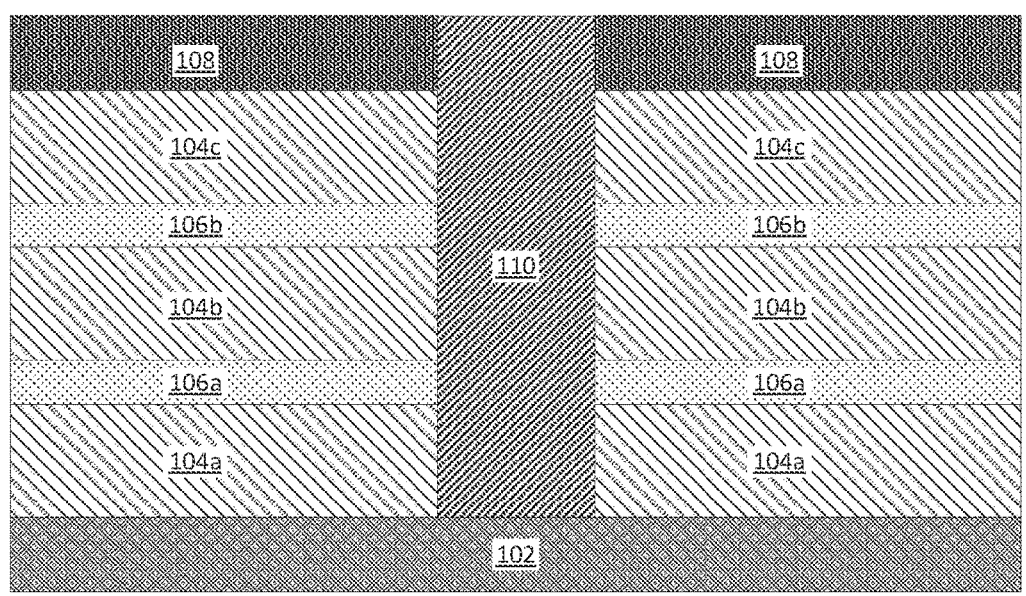
FIG. 4 is a cross-sectional view of the semiconductor device of FIG. 3 after additional fabrication operations, according to embodiments.

Referring now to FIG. 4, this figure is a cross-sectional view of the PCM memory cell 100 of FIG. 3 after additional fabrication operations, according to embodiments. As shown in FIG. 4, a first electrode 110 is formed on the substrate 102 in the area etched away as described with reference to FIG. 3. The electrodes may serve as word lines or bit lines for the PCM memory cell 100. The first electrode 110 may include any suitable material in accordance with the embodiments described herein. Examples of suitable materials that can be included in the first electrode 110 include, but are not limited to, copper, titanium-based materials (e.g., titanium nitride), tantalum-based materials (e.g., tantalum nitride), and tungsten-based materials). In certain embodiments, following the formation of the first electrode 110 a planarization process such as CMP may be performed on the PCM memory cell 100 so that the top surface of the first electrode 110 is coplanar with the top surface of the hardmask 108.

Figure 5:
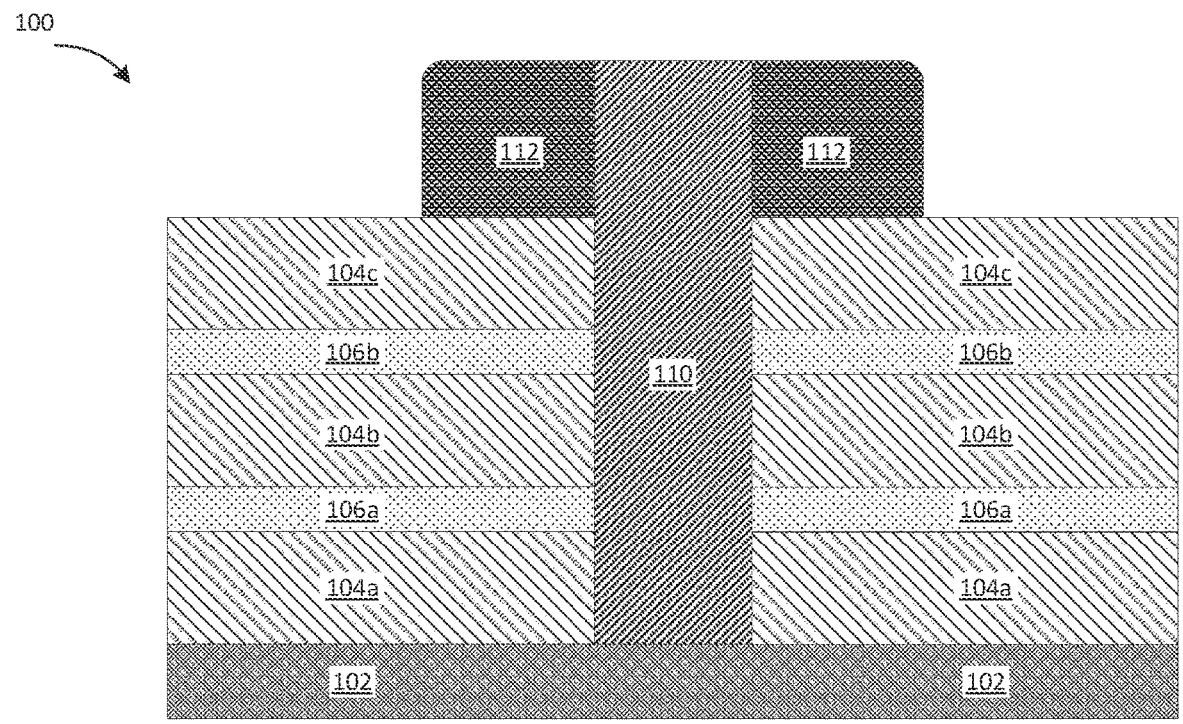
FIG. 5 is a cross-sectional view of the semiconductor device of FIG. 4 after additional fabrication operations, according to embodiments.

Referring now to FIG. 5, this figure is a cross-sectional view of the PCM memory cell 100 of FIG. 4 after additional fabrication operations, according to embodiments. As shown in FIG. 5, the hardmask 108 is removed with any suitable material removal process such as RIE. Then, spacers 112 are formed around the first electrode 110 using a deposition process followed by a material removal process such as RIE. The spacers 112 may comprise a suitable dielectric material such as, for example, SiN.

Figure 6:
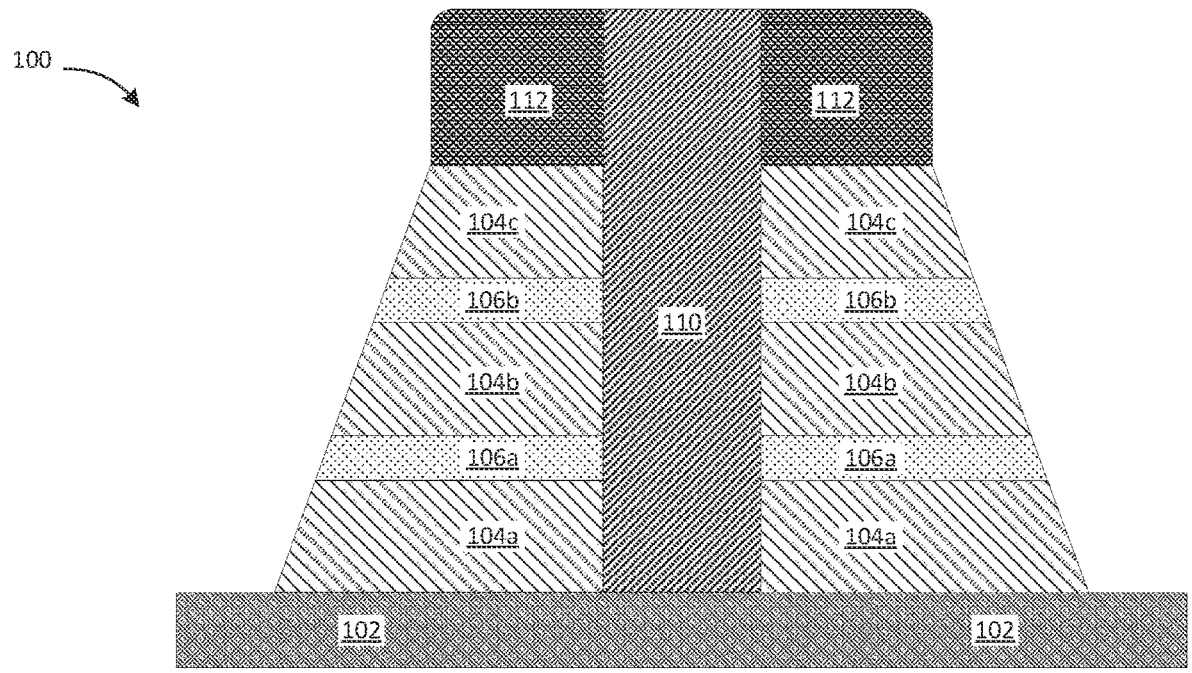
FIG. 6 is a cross-sectional view of the semiconductor device of FIG. 5 after additional fabrication operations, according to embodiments.

Referring now to FIG. 6, this figure is a cross-sectional view of the PCM memory cell 100 of FIG. 5 after additional fabrication operations, according to embodiments. As shown in FIG. 6, a material removal process is performed on the PCM stack (i.e., the first interlayer dielectric 104a, the first phase change material layer 106a, the second interlayer dielectric 104b, the second phase change material layer 106b and the third interlayer dielectric 104c) to create a tapered (or slanted) side profile. Thus, as shown in FIG. 6, this results in the first phase change material layer 106a being wider than the second phase change material layer 106b. In other words, the channel lengths of the first phase change material layer 106a is different than the second phase change material layer 106b. This allows for programming the PCM memory cell 100 in multiple steps (as will be described in further detail with respect to FIGS. 8A-8E below).

Figure 7:
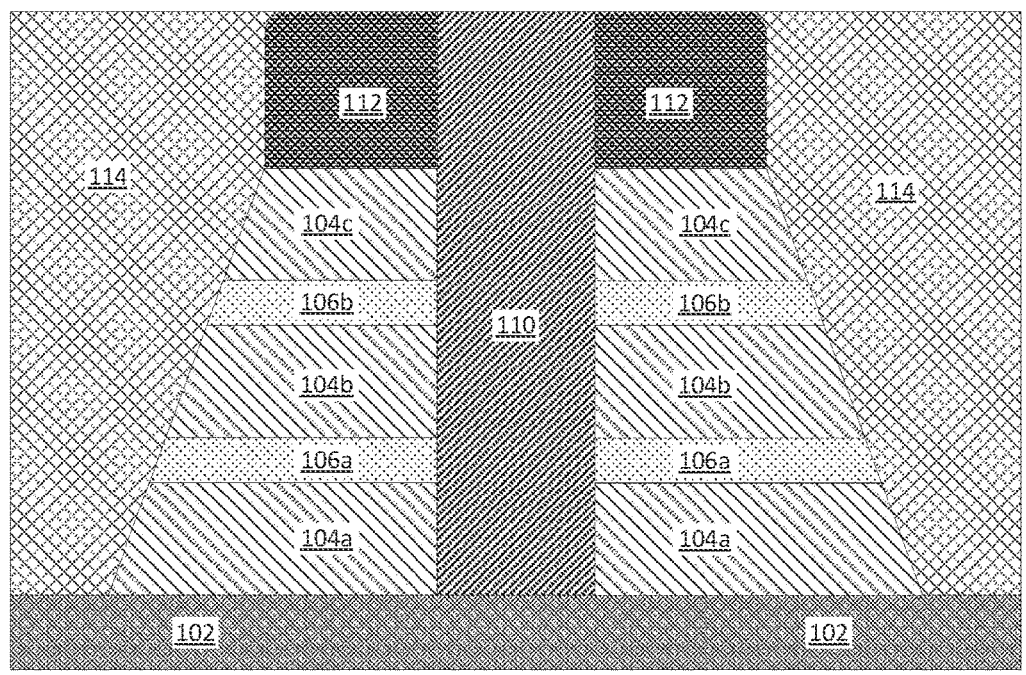
FIG. 7 is a cross-sectional view of the semiconductor device of FIG. 6 after additional fabrication operations, according to embodiments.

Referring now to FIG. 7, this figure is a cross-sectional view of the PCM memory cell 100 of FIG. 6 after additional fabrication operations, according to embodiments. As shown in FIG. 7, a second electrode 114 is formed around the PCM stack. The second electrode 114 may comprise any suitable conductive material and may be the same or different composition as the first electrode 110. In certain embodiments, a planarization process such as CMP may be performed so that the top surface of the second electrode 114 is coplanar with the top surfaces of the spacers 112 and the first electrode 110. Thus, in the example shown in FIG. 7, the PCM memory cell 100 has a symmetrical profile and may have a truncated conical shape when viewed from the top due the slanted side profile of the PCM stack. In one example, the first phase change material layer 106a may have the dimensions of 112 nm wide by 25 nm thick, whereas the second phase change material layer 106b may have the dimensions of 75 nm wide by 25 nm thick. It should be appreciated that other suitable widths and thicknesses may be used for these PCM layers and they need not have the same thicknesses or material compositions.

Figure 8A:
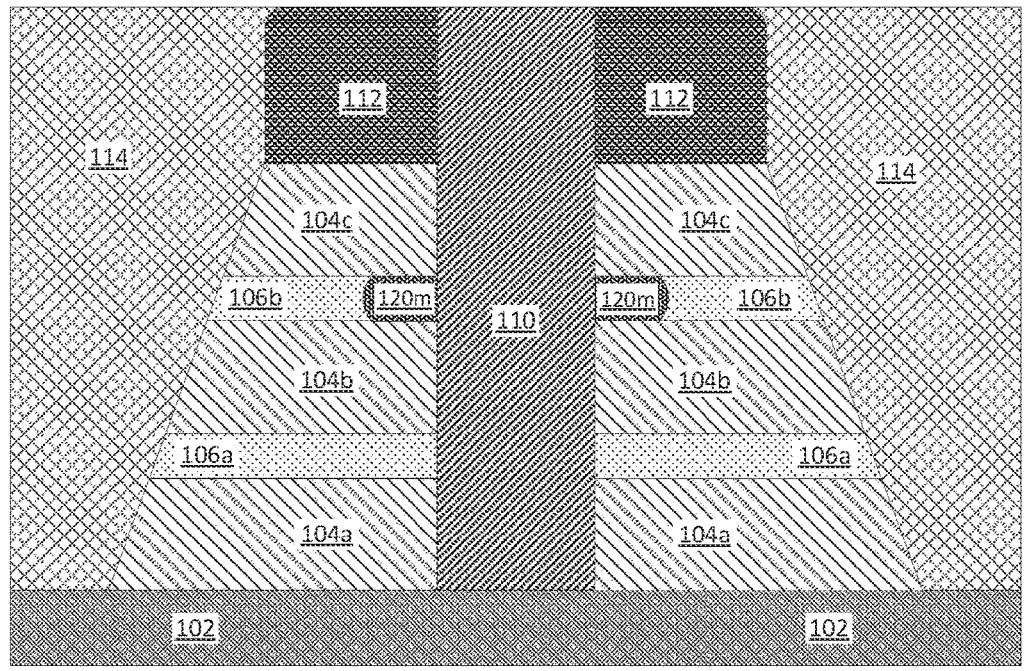
FIG. 8A is a cross-sectional view of the semiconductor device of FIG. 7 after a portion of a first phase change material layer is in a molten state, according to embodiments.

Referring now to FIGS. 8A-8E, these figures show a multi-step process of programming the PCM memory cell 100. Referring initially to FIG. 8A, this figure is a cross-sectional view of the PCM memory cell 100 of FIG. 7 after a molten portion 120m of the second phase change material layer 106b has been converted into a molten state. The remainder of the first phase change material layer 106b is in a crystalline state, as is the entirety of the first phase change material layer 106a. That is, due to the relatively wider/longer dimension of the first phase change material layer 106a, the first phase change material layer 106a has a relatively lower amount of heating as compared to the second phase change material layer 106b. Therefore, the molten portion 120m of the second phase change material layer 106b can reach a molten state without having any (or at least a much smaller portion) portion of the first phase change material layer 106a reaching a similar molten state. As mentioned above, memory switching in these materials is primarily an electro-thermal process, which involves a phase transformation from a crystalline to an amorphous state, and vice versa, under the influence of an applied voltage/current. When the heating process stops, the material of the second phase change material layer 106b retains its new state, thus exhibiting memory. In practice, this transformation is achieved by passing a current through the sample for some time. The transition to an amorphous state (the RESET operation) occurs by resistive heating up to the local melting point of the respective phase change layer to produce the amorphous portion.

Figure 8B:
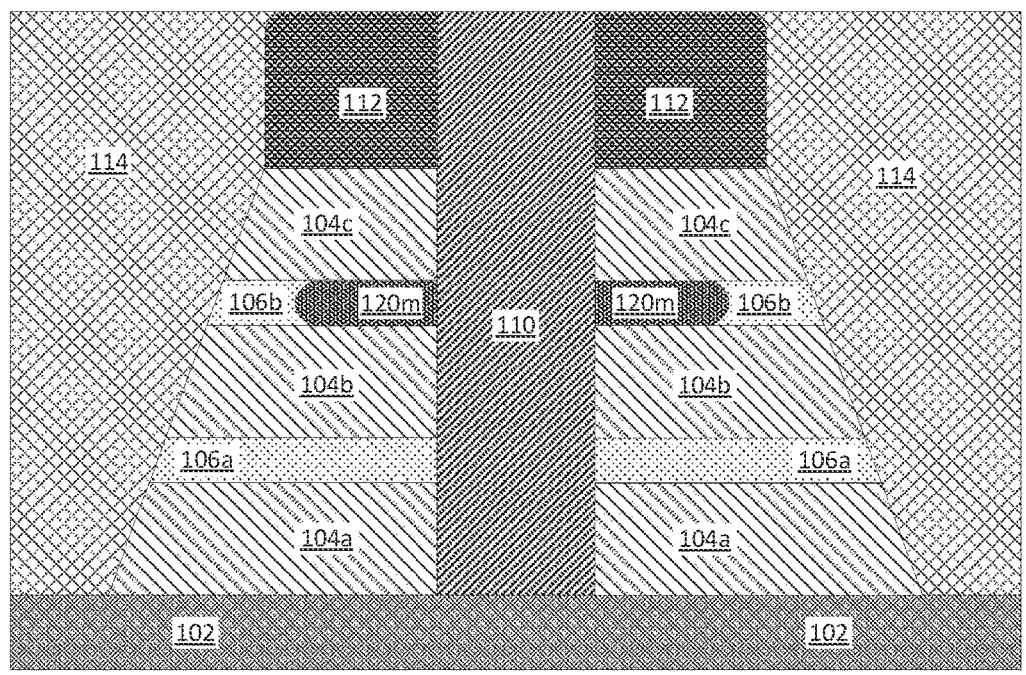
FIG. 8B is a cross-sectional view of the semiconductor device of FIG. 8A after a larger portion of the first phase change material layer is in the molten state, according to embodiments.
Figure 8C:
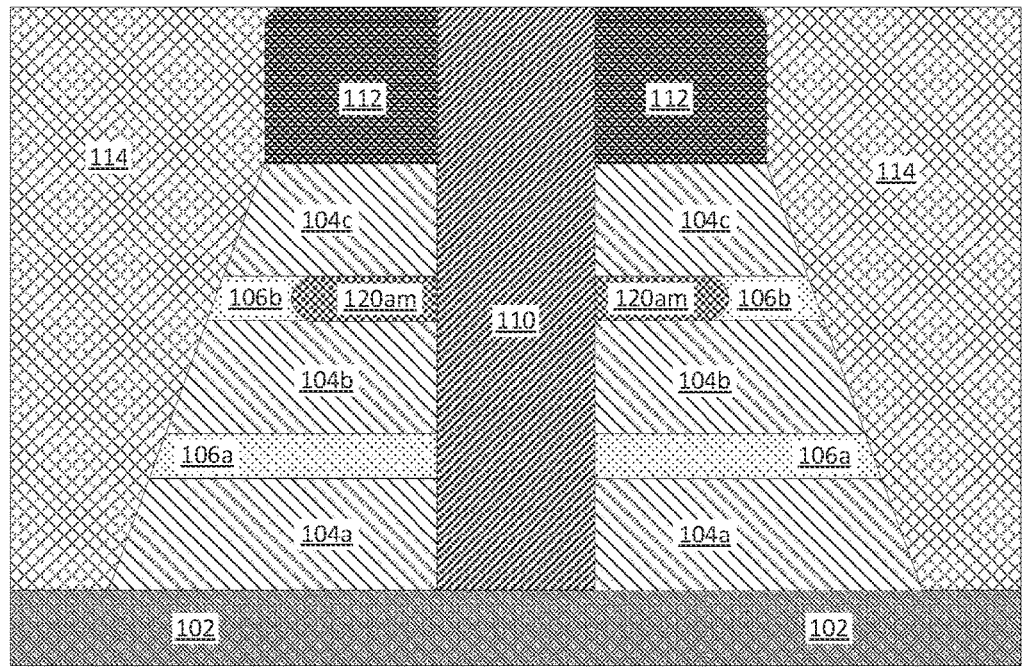
FIG. 8C is a cross-sectional view of the semiconductor device of FIG. 8B after the first phase change material layer has cooled to an amorphous state, according to embodiments.

In the example shown in FIG. 8A, the PCM memory cell 100 is starting with both channels (i.e., the first phase change material layer 106a and the second phase change material layer 106b) in the SET (crystalline) state, the shorter channel (i.e., the second phase change material layer 106b) is converted to an amorphous state (see also, FIG. 8B). In one nonlimiting example, a short ~50 ns 1 V pulse may be applied to heat the molten portion 120m of the second phase change material layer 106b to the molten state. In another example, a longer pulse (e.g., ~1 µs) may be applied with a lower voltage to change the state of the material to molten. As shown in FIG. 8B, the size of the molten portion 120m of the second phase change material layer 106b is increased according to the desired amount. The ultimate size of the molten portion 120m can thus be controlled without affecting the crystalline state of the first phase change material layer 106a. As shown in FIG. 8C, the molten portion 120m has been allowed to cool rapidly to form the amorphous portion 120am of the second phase change material layer 106b.

If it is desired to switch back to the low resistance crystalline state (the SET operation), a longer pulse may be applied to the entire PCM memory cell 100. Thus, to convert the PCM stack back to the SET state, voltage pulses with pulse height $V \geq V_{th}$ (threshold voltage) combined with a sufficiently low current and a sufficiently long trailing edge (e.g. ~10 µs) may be used. This can be done in a PCM memory cell 100 using a sufficiently large $V_{sd}$ and a small $V_g$ for the access transistor. $V_{th}$ varies with the leading-edge of the programming pulses (e.g., for a leading edge of ~10 µs, $V_{th}$ may be ~1V). It should be appreciated that the size of the amorphous plug or amorphous portion 120am can be formed to any suitable size by changing the pulse length of the applied voltage. For example, a pulse length of 5 ns at 1V may not be sufficient to cause any portion of the second phase change material layer 106b to convert to a molten state, a pulse length of 20 ns at 1V may cause a small portion to convert to the amorphous phase, and a pulse length of 50 ns at 1V may cause a larger portion to convert to the amorphous phase.

Figure 8D:
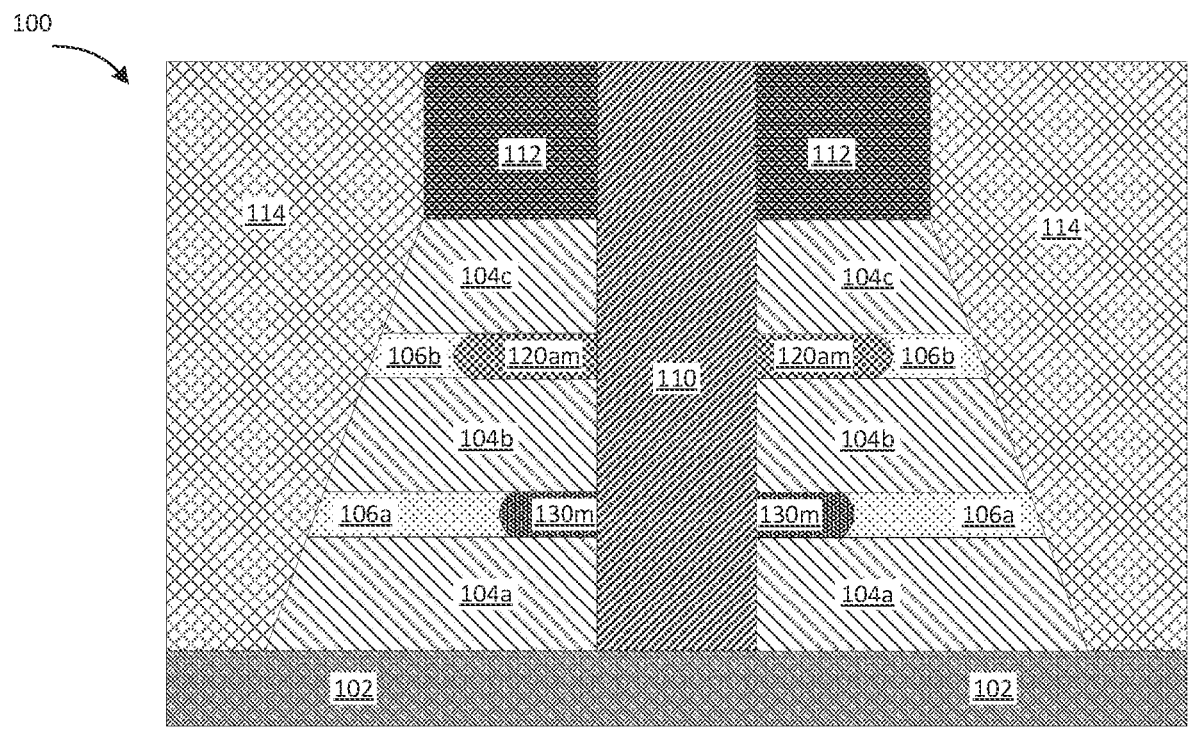
FIG. 8D is a cross-sectional view of the semiconductor device of FIG. 8C after a portion of a second phase change material layer is in a molten state, according to embodiments.
Figure 8E:
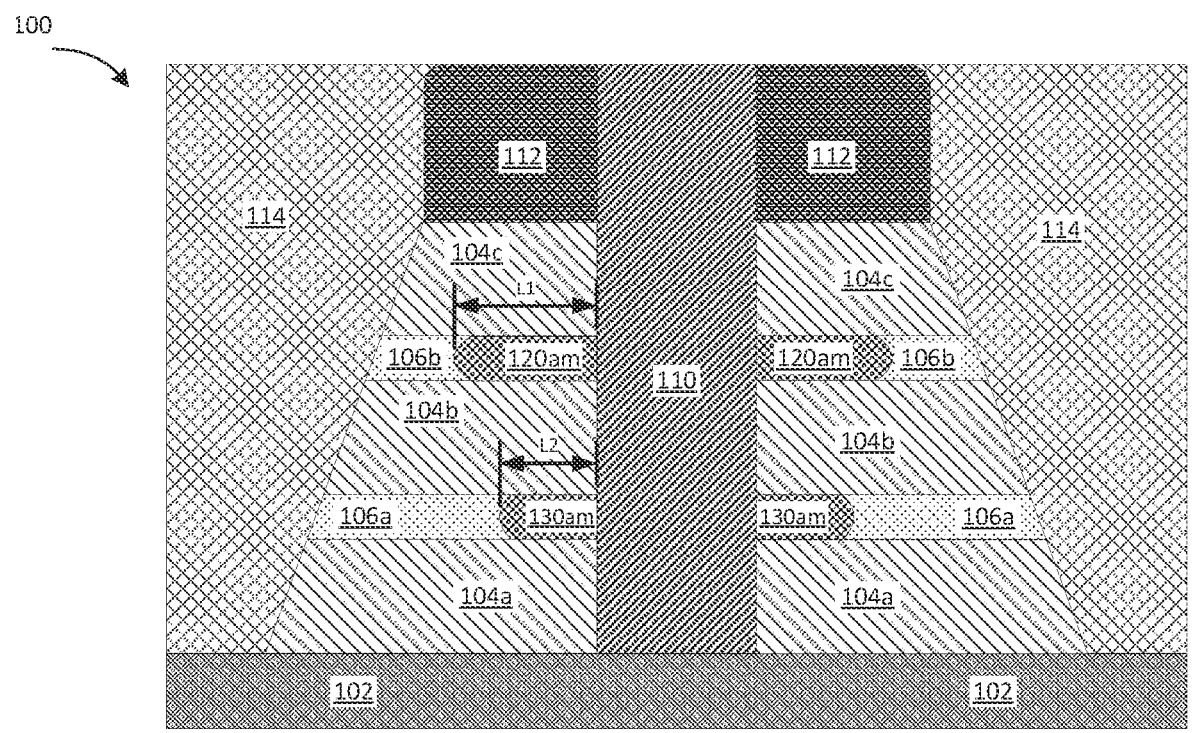
FIG. 8E is a cross-sectional view of the semiconductor device of FIG. 7 after the portion of the second phase change material layer has cooled to an amorphous state, according to embodiments.

Referring now to FIG. 8D, this figure is a cross-sectional view of the semiconductor device of FIG. 8C after an additional voltage pulse is applied, according to embodiments. As shown in FIG. 8D, a molten portion 130m of the first phase change material layer 106a is converted to a molten state, and then it is allowed to cool rapidly to form the amorphous portion 130am shown in FIG. 8E. The second amorphous portion 130am is formed with a suitable but different size from the first amorphous portion 120am by tuning the pulse length of the applied voltage. It should be appreciated that this second amorphous portion 130am of the first phase change material layer 106a may be formed without causing the amorphous portion 120am of the second phase change material layer 106b to revert back to the crystalline state. As mentioned above, to switch back to the low resistance crystalline state (the SET operation), generally a longer pulse may be applied. However, because the voltage pulse that is used to form the second amorphous portion 130am is shorter in duration than that which would be required to trigger the SET operation, the first amorphous portion 120am remains in the amorphous state even as the second amorphous portion 130am of the first phase change material layer 106a is formed. If it is desired to perform the SET operation on both of the first and second PCM layers, a longer voltage pulse may be applied to the PCM memory cell 100. It should be appreciated that it is also possible to perform a SET on just one of the phase change material layers (e.g., the second phase change material layer 106a) if a shorter pulse is applied that is sufficient to revert only one of the amorphous plugs (e.g. amorphous portion 130am) back to the crystalline state. That is, the second phase change material layer 106 may be set back to the SET state using voltage pulses with amplitude exceeding the threshold voltage and a sufficiently low current. Therefore, as described above, with the present embodiments, due to the different lengths and/or widths (and possibly different thicknesses and/or material compositions) of the phase change material layers, it is possible to form (or revert) different amorphous plugs to allow for a multi-bit analog memory device. It should be appreciated that the SET and RESET of the individual phase change material layers may be achieved by varying the voltage pulse length while keeping the voltage pulse amplitude constant, which simplifies the peripheral circuitry.

Figure 9:
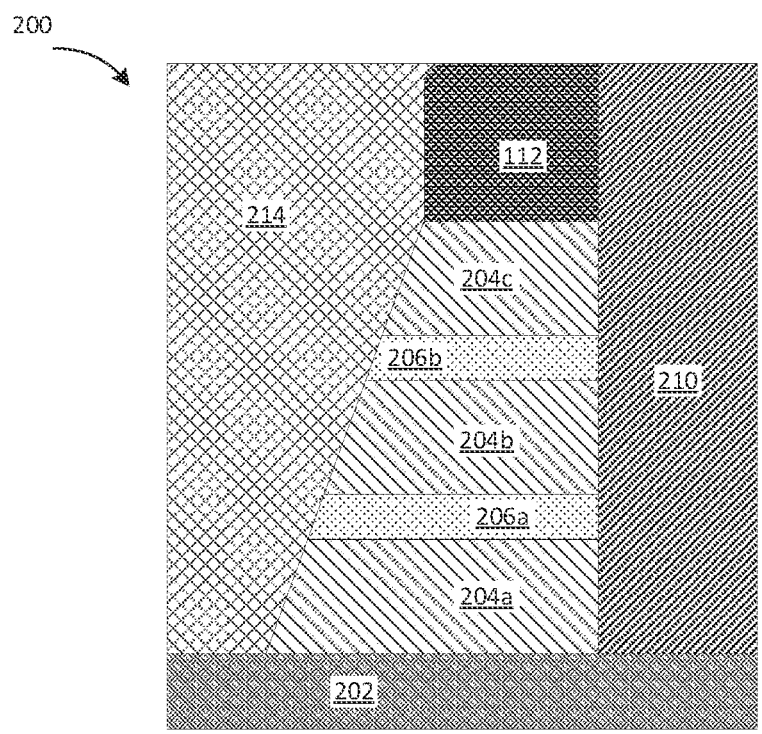
FIG. 9 is a cross-sectional view of a PCM memory cell semiconductor device having an asymmetric structure, according to embodiments

Referring now to FIG. 9, this figure is a cross-sectional view of a semiconductor device having an asymmetrical configuration, according to embodiments. As shown in FIG. 9, alternating layers of insulating layers and PCM layers (i.e., the first interlayer dielectric 204a, the first phase change material layer 206a, the second interlayer dielectric 204b, the second phase change material layer 206b and the third interlayer dielectric 204c) are formed on the substrate 202, with a first electrode 210 on one side and a second electrode 214 on the other side of the PCM stack. It should be appreciated that the various layers may have the same or different material compositions and dimensions as the analogous layers described above with the embodiment of FIGS. 1-7.

Figure 10:
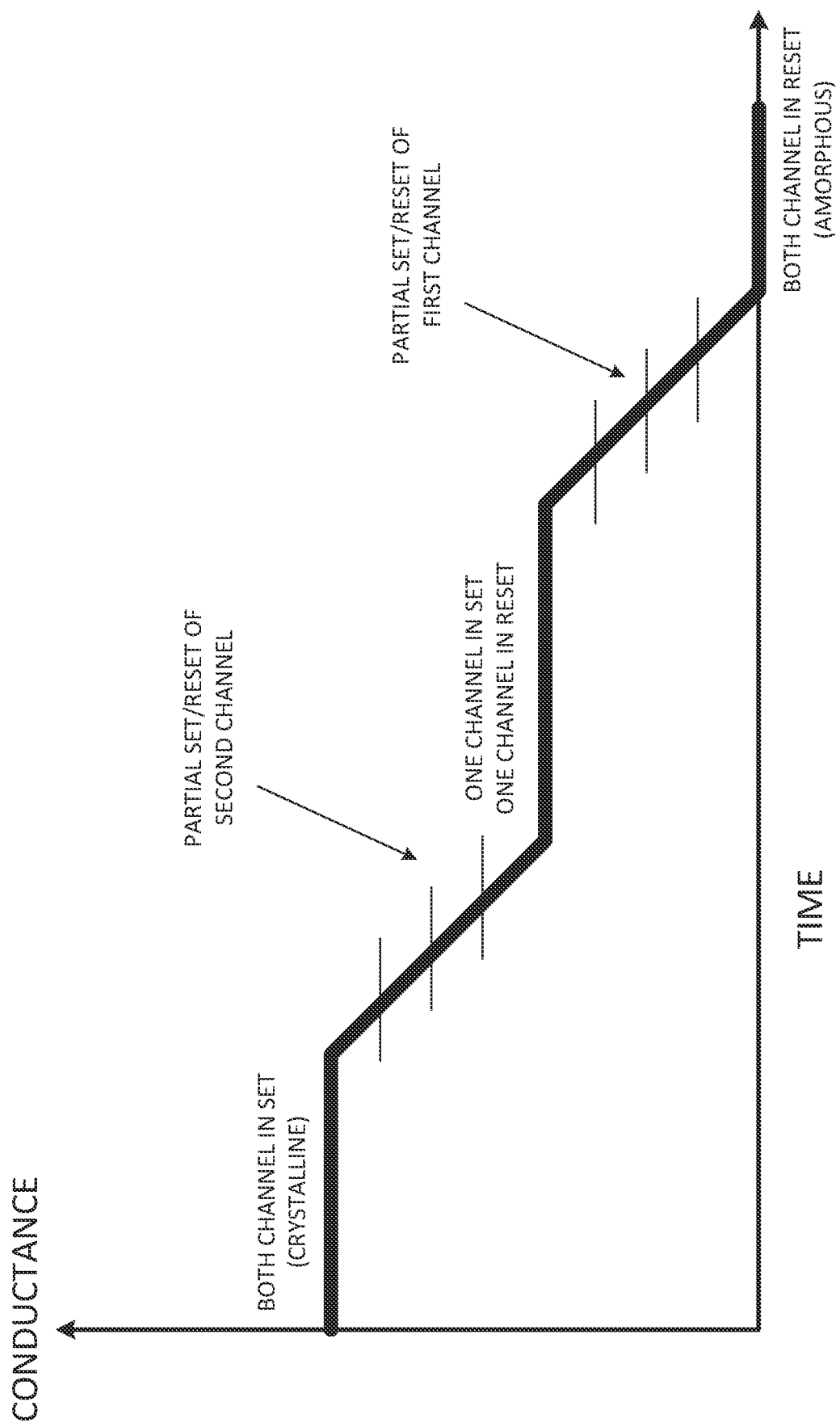
FIG. 10 is a chart showing the conductance profile of a PCM memory cell semiconductor device as the channels are converted from the crystalline state to the amorphous state, according to embodiments.

Referring now to FIG. 10, this figure is a chart showing the conductance profile of a PCM memory cell semiconductor device as the channels are converted from the crystalline state to the amorphous state, according to embodiments. The vertical axis refers to an overall conductance level of the PCM memory cell 100, and the horizontal axis generally refers to time (or additional voltage pulses that are applied to the device). As shown in FIG. 10, on the left hand side of the graph both of the channels are in the SET state (or crystalline state) and the conductance is the highest. After at least one voltage pulse is applied, one of the channels remains in the SET state and one of the channels is converted to the RESET state as an amorphous plug is formed in the phase change material layer. At this stage the device is in the form of the device shown in FIG. 8C, where the amorphous portion 120am is formed in the second phase change material layer 106b. At this state, the conductance is lowered to the level depicted in the middle of the chart of FIG. 10. After at least one additional voltage pulse is applied, both of the channels have been converted to the RESET state as an amorphous plug is formed in each of the phase change material layers. At this stage the device is in the form of the device shown in FIG. 8E, where the amorphous portion 120am is formed in the second phase change material layer 106b and the second amorphous portion 130am is formed in the first phase change material layer 106a. At this state, the conductance is lowered to the level depicted on the right side of the chart of FIG. 10. It should be appreciated that the PCM memory cell 100 may also be modified to be in a conductance state that is somewhere in between the low, middle and high conductance states, as depicted by the shorter horizontal lines in FIG. 10. In this example, one or both of the PCM channels may be partially SET/RESET by applying appropriate voltage pulses, and this may allow for greater flexibility to achieve a particular overall conductance for the device.

The descriptions of the various embodiments have been presented for purposes of illustration and are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A phase change memory (PCM) device comprising:
a first electrode formed on a substrate;
a phase change material stack formed on the substrate and surrounding the first electrode, the phase change material stack having a slanted side profile, and including at least two phase change material layers each separated by an insulating layer; and
a second electrode formed on and surrounding the phase change material stack,
wherein a first one of the phase change material layers has a length that is different from a length of a second one of the phase change material layers.

2. The PCM memory device according to claim 1, wherein the first and second phase change material layers are configured as nanowires.

3. The PCM memory device according to claim 1, wherein a difference in the lengths of the first and second phase change material layers is sufficient to enable performance on a RESET operation on the first phase change material layer without the performance of a RESET operation on the second phase change material layer.

4. The PCM memory device according to claim 3, wherein the first phase change material layer has a smaller length than that of the second phase change material layer.

5. The PCM memory device according to claim 1, wherein a difference in the lengths of the first and second phase change material layers is sufficient to enable performance on a RESET operation on the second phase change material layer without the performance of a SET operation on the first phase change material layer.

6. The PCM memory device according to claim 1, wherein the first and second phase change material layers each include at least one selected from the group consisting of GeSe, As—S, Sb—Te and $In_2Se_3GeAsTe$, or GeSbTe (GST).

7. The PCM memory device according to claim 1, wherein the phase change material stack has a symmetrical profile with a truncated conical shape.

8. The PCM memory device according to claim 1, wherein at least one of the first and second phase change material layers is doped with at least one selected from the group consisting of aluminum oxide ($Al_2O_3$), silicon oxide ($SiO_2$), tantalum oxide ($Ta_2O_5$), hafnium oxide ($HfO_2$), zirconium oxide ($ZrO_2$), cerium oxide ($CeO_2$), silicon nitride (SiN), and silicon oxynitride (SiON).

9. A method of manufacturing a phase change memory (PCM) device, the method comprising:
forming a first elect code of a substrate;
forming a phase change material stack on the substrate and surrounding the first electrode, the phase change material stack having a slanted side profile, and including at least two phase change material layers each separated by an insulating layer; and forming a second electrode on and surrounding the phase change material stack, wherein a first one of the phase change material layers has a length that is different from a length of a second one of the phase change material layers.

10. The method according to claim 9, wherein the first and second phase change material layers are configured as nanowires.

11. The method according to claim 9, wherein a difference in the lengths of the first and second phase change material layers is sufficient to enable performance on a RESET operation on the first phase change material layer without the performance of a RESET operation on the second phase change material layer.

12. The method according to claim 11, wherein the first phase change material layer has a smaller length than that of the second phase change material layer.

13. The method according to claim 9, wherein a difference in the lengths of the first and second phase change material layers is sufficient to enable performance on a RESET operation on the second phase change material layer without the performance of a SET operation on the first phase change material layer.

14. The method according to claim 9, wherein a material composition of the first phase change material layer is different from a material composition of the second phase change material layer.

15. The method according to claim 9, wherein the first and second phase change material layers each include at least one selected from the group consisting of GeSe, As—S, Sb—Te and $In_2Se_3GeAsTe$, or GeSbTe (GST).

16. The method according to claim 9, wherein at least one of the first and second phase change material layers is doped with at least one selected from the group consisting of aluminum oxide ($Al_2O_3$), silicon oxide ($SiO_2$), tantalum oxide ($Ta_2O_5$), hafnium oxide ($HfO_2$), zirconium oxide ($ZrO_2$), cerium oxide ($CeO_2$), silicon nitride (SiN), and silicon oxynitride (SiON).

* * * * *